United States Patent [19]

Lebailly

[11] 4,068,252
[45] Jan. 10, 1978

[54] REVERSIBLE OPTOELECTRONIC SEMICONDUCTOR DEVICE

[75] Inventor: Jacques Lebailly, Caen, France

[73] Assignee: U.S. Philips Corporation, New York, N.Y.

[21] Appl. No.: 703,550

[22] Filed: July 8, 1976

[30] Foreign Application Priority Data

July 28, 1975 France ............................... 75.23457

[51] Int. Cl.$^2$ .................... H01L 33/00; H01L 29/161
[52] U.S. Cl. ....................................... 357/17; 357/16; 357/19; 357/30
[58] Field of Search ...................... 357/17, 18, 19, 16, 357/30

[56] References Cited

U.S. PATENT DOCUMENTS

| | | | |
|---|---|---|---|
| 3,414,733 | 12/1968 | Wunderman | 250/227 |
| 3,838,359 | 9/1974 | Hakki | 331/94.5 |
| 3,993,963 | 11/1976 | Logan | 331/94.5 |
| 4,011,113 | 3/1977 | Thompson | 148/175 |

OTHER PUBLICATIONS

Gilleo et al., Opto-Electronic Devices, 1964, pp. 249–253.

Primary Examiner—Martin H. Edlow
Attorney, Agent, or Firm—Frank R. Trifari

[57] ABSTRACT

A reversible optoelectronic device for use in a narrow range of light wavelength, comprising a semiconductor body comprising at least one transparent surface region of a first conductivity type and an assembly of two active regions, one of said active regions having a first conductivity type and another said active region having the opposite conductivity type and determining a semiconductor junction having electroluminescent and photosensitive properties, said assembly of said two active regions consisting of a material having a smaller forbidden bandwidth that the material of said surface region, said surface region being a strongly doped and localized in a deposited layer that is of the same composition and that has a low doping, the depth of said junction with respect to the boundary between said layer and said assembly of active regions being between one-half and one-quarter of the diffusion length of the minority carriers in said active region of the first type, and said material of said assembly being selected such that the sum of one third of said diffusion length of minority carriers in said first conductivity type active region and of the diffusion length of said minority carriers in the active region of said opposite conductivity type is between one and three absorption lengths of light rays of said wavelength range.

15 Claims, 6 Drawing Figures

REVERSIBLE OPTOELECTRONIC SEMICONDUCTOR DEVICE

BACKGROUND OF THE INVENTION

The present invention relates to a reversible optoelectronic device for use in a narrow range of light wavelength, comprising at least one transparent surface region of a first conductivity type and an assembly of two active regions, of which one active region has a first conductivity type and another active region is of the opposite type. The active regions determined a semiconductor junction having electroluminescent and photosensitive properties, the material of the assembly of the two active regions having a smaller forbidden bandwidth than that of the material of the surface region.

In telecommunications, coupling circuits require semiconductor components, in particular radiation emitters such as electroluminescent diodes and lasers, receivers, such as photodiodes, and transmission means which are usually optical fibers. In certain cases, the telecommunications are in two senses; for example, in telephony it appears advantageous transmission-type systems to use components which can also be used readily in emitters and in receivers.

The transmission-type systems preferably use determined light wavelengths that correspond with those providing the best; transmission efficacies by optical fibers, in particular, the narrow bands of the spectrum centered on 1.06 $\mu$m and on 0.83 $\mu$m, the electroluminescent source devices for which contain an active part where a p-n junction is situated and a transparent surface layer made from a material having a forbidden bandwidth larger than that of the material of the active part.

However, these known devices, if they have good characteristics in electroluminescence, are not good photo-receivers; the conditions of optimizing their characteristics and those of a photosensitive diode are considered different, even opposite, in particular as regards the doping levels, the depth of the junction or the levels of polarisation voltage. For example, the efficacy of the electroluminescent diode increases with the doping level; on the contrary, a photodiode is preferably little doped in order that its capacity be minimum, such capacity determining actually the rapidity of the response of the diode. In the same way, the junction of the electroluminescent devices is sufficiently deep, so that the recombinations near one surface are not radiative. On the contrary, a large depth is a drawback in the case of photodetection, for it entails a stronger absorption outside the collecting region of carriers.

In electroluminescent devices it is endeavoured to eliminate the absorption of the emitted radiation, which absorption is on the contrary necessary in the active part of a photodiode. It is to be noted that the absorption is defined here by the coefficient of absorption $\alpha$ of a material, or by the absorption length L which is the distance at which the intensity of a radiation is reduced in a ratio $(1/e)$, $\alpha$ being equal to $1/L$.

OBJECTS OF THE INVENTION

The main object of the invention is to mitigate the drawbacks of the known devices as regards their use for the two purposes of reception and emission of light, in particular as regards their use for such two purposes in a narrow range of wavelength corresponding to the best transmission conditions and in a domain of low voltages of the order of the supply of circuits in microelectronics.

Another object of the invention is to provide a reversible electroluminescent device which, used as a photodetector, has a good sensitivity in a narrow range of wavelength, as well as a rapid response, with polarisation voltages of the order of those which are used in electronic microcircuits.

DESCRIPTION OF THE INVENTION

According to a preferred embodiment of the invention (as exemplified in FIG. 3), the reversible optoelectronic device usable in a narrow range of light wavelength, comprises at least one transparent surface region of a first conductivity type and an assembly of two active regions, of which one active region is of the first conductivity type and another active region is of the opposite conductivity type, such regions determining a semiconductor junction having electroluminescent and photosensitive properties. The material of the assembly of the two active regions has a smaller forbidden bandwidth than the material of the surface region. The surface region is a strongly doped region, localized in a deposited layer that is of the same composition but having a low doping level, the depth of the junction with respect to he boundary between the layer and the assembly of active regions being about between one half and a quarter of the diffusion length of minority carriers in the active region of the first conductivity type. The material of the assembly is such that the sum of one third of such diffusion length and the diffusion length of the minority carriers in the active region of the opposite conductivity type is between one and three absorption lengths of light rays of the wavelength range.

The surface region comprises a window which can act as a filter that passes shorter wavelengths of the spectrum of the light received by the device when it is used as a photodetector. At the same time, due to its high doping, the surface region constitutes a contact region and its location permits limiting the active region of the device to the useful area thereof, for example, the very small area corresponding to the section of an optical fibre or a bundle of optical fibres. Moreover, the localisation of the active region permits the reduction of the capacity of the diode used in photodetection with respect to a non-localized known diode. The ratio of the impurity concentrations in the surface region and in the deposited layer is preferably higher than 10 and advantageously higher than $10^2$. Moreover, the low doped layer within which the surface region is present produces, by the difference in forbidden bandwidth of the material which it constitutes with respect to that of the assembly of active regions, a potential barrier which ensures a confinement of the charge carriers both due to their collection in the case of utilisation as a photodiode and due to their recombination in the case of utilisation as electroluminescence, which is experienced by an elimination of the non-radiative surface recombinations. Moreover it is known that the recombination rate of the charge carriers, at the interface between an active layer and a layer covering it and made of a material having a different forbidden bandwidth, is lower than the recombination rate of the charge carriers at the surface of an identical active layer when the surface there is free, the collection of charge carriers consequently being better there.

With the surface layer it is possible to have a junction depth which is smaller with respect to the interface between the materials having different forbidden bandwidths. This is favorable in the case of photodetection and permits satisfying the condition as regards the ratio between the junction depth and the diffusion length of minority carriers in the active region of the first type. Preferably, such ratio is 1:3. This latter condition ensures, in the case of photodetection, an optimum efficiency of electron collections, no matter what is the thickness of the depletion zone on either side of the junction.

It has already been tried to improve the performances of detection photodiodes by providing a structure having a transparent surface layer made of a material having a forbidden bandwidth larger than that of the material of the active zone. For example, British Batent No. 1,044,494 discloses a photodetector device employing such dispositon, but the device there, in order to obtain a good sensitivity, requires a large thickness of the depletion zone between three and five absorption lengths of the detected radiation, which necessitiates a low doping or a comparatively high polarisation voltage. Such a diode, used in electroluminescence, would have a very low efficacy, since the doping is less than that necessary for a depletion zone of a large thickness and the junction is too deep to obtain a good luminous efficiency.

On the contrary, in the device according to the invention, the possibility of having a small junction depth, at least with respect to the surface layer, limiting such depth to a fraction of the diffusion length of the minority carriers, and to associate in it a potential barrier, are used to ensure an efficacious collection of charge carriers in the whole active region of the first type and to dispense with having a depletion zone of a large thickness, in the case of photodetection.

The device is destined to be supplied with or polarised under a very low voltage, of the order of voltages used in microelectronic devices. It is considered that the envisaged voltages in such circuit are between 1 and 10 volts. Preferably the material of the active regions is such that, under the operating voltage applied in the reverse direction, the depletion zone extends from the junction over a distance smaller than one third of the diffusion length of the minority carriers in the said active region of the first conductivity type.

Since the depletion zone has a very small thickness, on one side smaller than one third of the diffusion length of the minority carriers, the overall thickness of active material in photodetection is substantially equal to the sum of the junction depth and the diffusion length of minority carriers in the region of the opposite conductivity type. Since such sum is larger than an absorption length, the device has a good sensitivity in photodetection. Since, moreover the overall thickness of active material is limited, the device has a strong sensitivity in photodetection for a narrow wavelength range, corresponding to the wavelength of its own emission.

Figure 5:
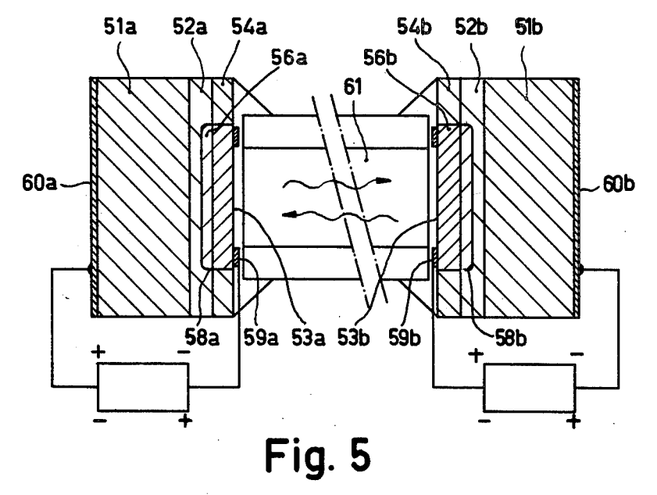
FIG. 5 is a diagrammatic sectional view of a reversible photocoupler.

It is possible to realize a reversible photocoupling with two identical devices, one of which is used for electroluminescence when the other is used for photodetection (see, e.g. FIG. 5).

The material of the assembly of the active regions preferably has a direct band structure and is doped with impurities of a very low ionisation energy, which impurities are called superficial. In elctroluminescence, the majority of the recombination transitions take place from band to band, the material is absorbant for the light it emits, and the absorption length is short.

In a first preferred embodiment of the invention (see, e.g., FIG. 2) the device comprises an epitaxial surface layer of a material having a larger forbidden bandwidth of the N-type, an underlying epitaxial layer of a material having a smaller forbidden bandwidth of the N-type and a substrate of the N+ type, and the regions of the opposite type are diffused regions obtained by the same localized diffusion from the surface of the device. The PN junction is formed by the diffused P region and the N layer smaller forbidden bandwidth. The diffusion permits of realising a $p$ region having an impurity concentration progressively decreasing from the surface, which is favourable for contact purposes. In addition, an impurity concentration profile of the gradual type is more favourable for the limitation of the capacity of the junction, in the case of photodetection, than an abrupt concentration profile.

In another embodiment, (see, e.g., FIG. 3) the device comprises an N type epitaxial surface layer of a material having a larger forbidden bandwidth, an of the P type intermediate epitaxial layer of a material having a smaller forbidden bandwidth, an underlying epitaxial layer of the same material but of the N type, and a substrate of the N+ type, and the surface region of the P+ type, which region is produced by locally diffusing from the surface of the device until the P type layer is reached. The P-N junction is formed by the adjacent P and N type epitaxial layers. This structure permits having a junction between only epitaxial material whose electroluminescence and photodetection properties may, for certain material, be better than those of diffused materials. Although in this case the junction is not localised, the localisation of the active zone is obtained by the surface region of the P+ conductivity type conducting the current or the electric field.

According to a variation of this embodiment (e.g., FIG. 3), the surface layer of a material having a larger forbidden bandwidth is of the P type and has a low doping level the intermediate layer is of the P type, the underlying layer is of the N type and the diffused region is of the P+ type. Thus the localisation of the active zone is obtained by a concentration effect of the current lines or the electric field lines due to the diffused P+ region.

In another embodiment (exemplified in FIG. 4), the device comprises a very thin P type epitaxial surface layer of a material having a larger forbidden bandwidth, an intermediate N type epitaxial layer of a material having a smaller forbidden bandwidth, a P type underlying epitaxial layer of the same material, and a substrate of the P+ type, and an N+ type surface region obtained by local implantation of ions through a suitable mask, the surface region connecting the layer of the N type and the PN junction being between the adjacent P and N epitaxial layers. This embodiment has the same advantages as the preceding embodiment but it presents an advantage of speed due to the fact of the greater mobility of the minority electrons in the P+ region with respect to the minority holes in the N region.

The difference in forbidden bandwidth between the materials of the surface layer and the adjacent layer preferably corresponds to a potential barrier of at least 0.1 volt, for example approximately 4 kT at the absolute temperature T corresponding to an ambient temperature t of 25° C.

A photocoupling assembly (see, e.g., FIG. 5), formed from devices according to the invention comprises two devices and a means for transmitting the light, usually an optical fibre or a bundle of optical fibres. The active faces of the devices are placed perpendicularly to the generatrix of the optical fibres, face to face in the case of straight fibres.

According to another embodiment, the two photocoupling devices are co-planar, the light being transmitted from one to the other, for example, by optical fibres having the required curvature.

Figure 6:
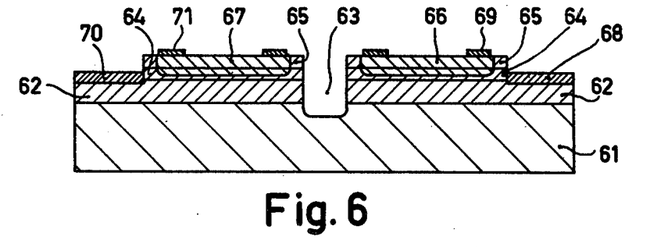
FIG. 6 is a diagrammatic sectional view of a monolithic assembly comprising a coplanar emitter and photodetector.

In the case of a co-planar structure, the detector device and the emitter device are advantageously manufactured in the same plate of semiconductor material and form a monolithic assembly comprising two local junctions insulated from each other either by a diffused insulation zone or by a groove possibly provided with an insulating material (see, e.g., FIG. 6).

The invention can be applied to the transformation of electrical signals into optical signals and conversely and to the transmission of electrical signals through optical fibres. The device according to the invention is particularly suitable for the photodetection and the electroluminescent emission in the case of transmission through optical fibres in the ranges of 1.06 and 0.83 μm. The invention may also be applied for the realisation of symmetrical photocouplers which may be used in the two directions.

PREFERRED EMBODIMENT

Figures 1, 2, 3, 4:
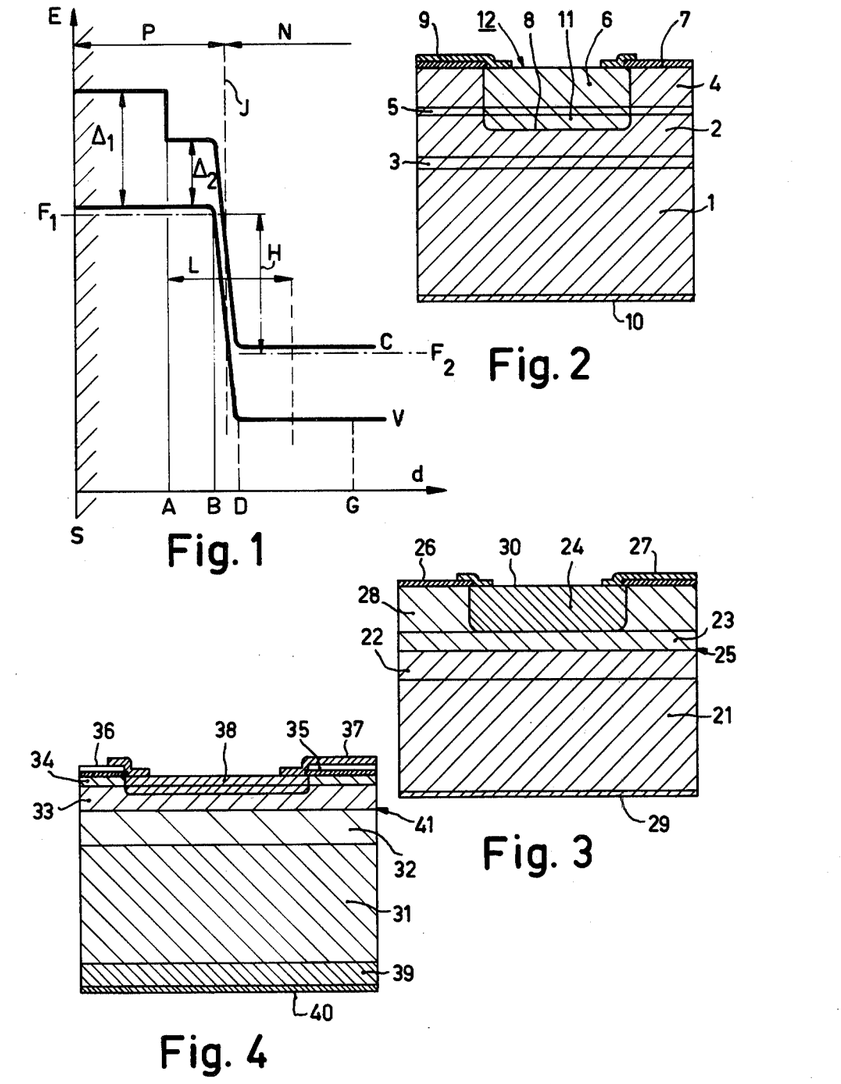
FIG. 1 shows an energy diagram, as a function of the distance from the surface, in a device having a potential barrier according to the invention.
FIG. 2 is a diagrammatic sectional view of a first embodiment of a device.
FIG. 3 is a diagrammatic sectional view of another embodiment of a device.
FIG. 4 is a diagrammatic sectional view of a third embodiment of a device.

The diagram shown in FIG. 1 is an example of a diagram of levels of energy E of the various layers of a hetero structure as a function of the depth "d" with respect to the surface S. The curve C represents the limit of the conduction band, the curve V the limit of the valence band; between said curves is a forbidden band, the lines $F_1 F_2$ situating the so-called Fermi levels. The regions P near the surface and the regions N define a junction J. The surface layer up to the interface A is a transparent window layer having a forbidden bandwidth $\Delta_1$ which is larger than the forbidden bandwidth $\Delta_2$ of the underlying layer, $\Delta_1 - \Delta_2$ corresponding to a poential barrier of at least 0.1 V. The distance between the junction J and the interface A is substantially equal to one third of the diffusion length of the electrons in the layer between the interface A and the junction J.

On the other hand, the segment L represents an absorption length of light rays of the interesting range of wavelength in the material having a smaller forbidden bandwidth $\Delta_2$, the length of the segment L is equal to $1/\alpha$, $\alpha$ being the absorption coefficient, and the absoprtion length corresponding to a decrease of the intensity incident in the range $1/e$.

The diffusion length of the electrons in the region situated between A and B being $1_e$ the and diffusion length of the holes in the region situated between D and G being $1_t$, $L < (1_e/3) + 1_t$.

An inverse polarisation under a low voltage is applied to the diode and corresponds in the diagram to the space H between the Fermi levels on either side of the junction. With such polarisation, the depeletion zone extends in the region P over a distance smaller than $(1_e/3)$.

In the example shown in FIG. 2, the device is manufactured on a substrate 1 of gallium arsenide of the N+ type, it comprises an N type epitaxial layer 2 of gallium indium arsenide $Ga_{1-x}In_xAs$ in which $x = 0.2$. Between the layer 2 and the substrate 1 is provided an intermediate layer 3 having a progressive variation in composition. An N type epitaxial layer 4 of gallium arsenide covers the layer 2 with the interposition of an intermediate layer 5 having a progressive variation in composition. A region 6–11 of the P type is diffused in the layers 4, 5 and 2 in such manner as to form a PN junction 8 in the layer 2 where it penetrates 0.7 μm, which distance is equal to one third of the diffusion length of the electrons in the region 11 which is substantially 2 μm for a material of having a zinc doping level such that $N_A - N_D = 10^{18}$ per cm³. The diffusion length of the holes in the layer 2 beyond the junction is having a the order of 4 μm for a material of doping level of tellurium such that $N_D - N_A = 1.3 \times 10^{16}$ per cm³.

The absorption coefficient $\alpha$ of a radiation of wavelength 1.06 μm in the material of the layer 2 is 3000 cm⁻¹, for example an absorption distance of 3 μm, smaller than the sum of the third of the diffusion length of the electrons in the region 11 and the diffusion length of the holes in the remainder of the layer 2.

The receiving or emitting surface 12 of the device is moreover insulated by a dielectric layer 7 and metal deposits 9 and 10 are provided on the two opposite faces for purposes of contact of electrical connections.

In the example shown in FIG. 3 the device comprises a substrate 21 of gallium arsenide of gallium aluminum arsenide $Ga_{1-y}Al_yAs$, in which $y = 0.15$ then, an epitaxial layer 23 of gallium aluminium arsenide of the same composition but of the p-type thus forming a junction 25, then an epitaxial surface layer 28 of $Ga_{1-y}Al_yAs$ of a composition corresponding to $y = 0.30$, thus presenting a forbidden bandwidth larger than that of the layers 22 and 23. The layer 28 is of the p type having a low doping concentration, for example $5 \times 10^{16}$ per cm³ of germanium and a local P+ type region 24 having a strong doping concentration, for example $10^{19}$ per cm³, of zinc, is diffused in the layer 28 so as to approach or reach the layer 23. According to a modified embodiment, the surface layer 28 is of the N type having a low doping concentration and the diffusion of the P+ type reaches or penetrates into the layer 23.

The region 24, while conducting the current or the electric field, localises the active part of the layers 22 and 23 to the surface of said layers situated below the region 24.

The face 30, alternately receiving or emitting, is moreover insulated due to the dielectric layer 26 and metal deposits 27 and 29 are provided on the two opposite faces for purposes of contacting electrical connections. The thickness of the layer 23 is 1.5 μm, the diffusion length of the electrons being 5 μm. The thickness of the layer 22 is 10 μm and the diffusion length of the holes is 4 μm. The absorption length of a radiation of wavelength 0.85 μm is substantially 3 μm in the material of the layers 22 and 23. If an inverse voltage of 5 volts is applied to the diode, the depletion zone extends in the layer 23 over a distance of 0.5 μm.

In the device shown in FIG. 4, the conductivity types of the various regions are inverted with respect to the devices of FIGS. 2 and 3. This device comprises on a P type substrate 31 of gallium arsenide a P type epitaxial layer 32 of gallium aluminium arsenide $Ga_{1-y}Al_yAs$ in which $y = 0.1$ doped with germanium the thickness of which is 10 μm. On the layer 32 extends an N type epitaxial layer 33 of gallium aluminium arsenide $Ga_{1-y}Al_yAs$, in which $y = 0.15$ doped with tin, having a thickness of 1.5 μm and on said layer 33 a P type epitaxial layer 34 of gallium aluminum arsenide $Ga_{1-y}Al_yAs$ (in which $y = 0.30$) of the P type doped with germanium and having a thickness of 0.5 μm.

Insulating layers of silicon nitride 35 and silicon oxide 36 protect the non-active surface of the device and serve as masks during the ion implantation during which the N+ type region 38 doped with silicon is formed which penetrates down to the layer 33 and constitutes an island of current passage or concentration of the electric field limiting the surface of the active regions.

The assembly shown in FIG. 5 is a photocoupler using two identical devices of the type described with reference to FIG. 2 of gallium indium arsenide on, for example, gallium arsenide.

The devices respectively comprise a substrate 51a-51b an epitaxial layer 52a - 52b, and a surface layer 54a - 54b which is also epitaxial and of a compound having a larger forbidden bandwidth than the compound of the layer 52a - 52b, as well as a diffused region 56a - 56b that forms a junction 58a - 58b. Electric connection is via/59a - 59b provided on active surface 53a - 53b and 60a - 60b on the opposite face. The two identical devices are connected by an optical fiber 61 the connection between the optical fiber 61 and the active faces being produced by means of a transparent adherent coupling material of adequate refractive index. The two devices are supplied so as to be polarized, either one direct and the other inverse, or one inverse and the other direct. The optical transmission of an electric signal may thus be produced in the two directions in substantially identical conditions.

The device shown in FIG. 6 is a symmetrical device comprising two parts, one of which is used as an emitter while the other is used for detection, and inversely. This device comprises an insulating or semi-insulating substrate 61 on which a first layer 62 of a strongly doped first semiconductor material is deposited, a second layer 64 of the same material but, weakly doped and a third surface layer 65 of a semiconductor material having a larger forbidden bandwidth. Two identical diffused regions 66 and 67 are manufactured. The two parts of the device are insulated from each other by a groove 63 cut down to the substrate 61. Contacts 69 and 71 are provided on each of the diffused regions with contacts 68, 70 on each of the parts of the layer 62 at.

The diagrammatic sectional view shown in FIG. 6 may be that of a device which is rectangular or forms two semicircles or any other symmetrical geometrical figure. The transmission from one junction to the other is obtained by any available optical means of appropriate geometry. For applications in the wavelength range centered at 1.06 μm, corresponding to favorable conditions for transmission through optical fibers, the material preferably used for the manufacture of the device is a semiconductor compound comprising gallium, indium, arsenic, and in particular $Ga_{1-x}In_xAs$ where $x$ is of the order of 0.17 and at least between 0.15 and 0.22 for the layers where the active regions are situated, the surface layer and possibly the substrate being of gallium arsenide. In the case of such compositions, as in all the cases in which adjacent materials have a substantial difference in crystal lattice, it may be necessary to interpose, as between the layer of GaInAs and gallium arsenide, a layer having a minimum thickness and a progressive variation in composition, which can be made by known methods of epitaxy.

For applications in the wavelength range centered at 0.83 μm, corresponding to another transmission band of optical fibers of silicon, the material preferably used for the manufacture of the device is a semiconductor compound comprising gallium, aluminum, arsenic, and in particular $Ga_{1-y}Al_yAs$ in which $y$ is of the order of 0.15 and at least between 0.10 and 0.20 for the layers where the active regions are situated and $y$ is of the order of 0.30 for the surface layer, the substrate being possibly of gallium arsenide. With such compositions, an intermediate layer having a progressive composition variation is not necessary, the crystal lattices being substantially equal.

What is claimed is:

1. A reversible optoelectronic device for use in a narrow range of light wavelength, comprising a semiconductor body comprising at least one transparent surface region of a first conductivity type and an assembly of two active regions, one of said active regions having a first conductivity type and another said active region having the opposite conductivity type and determining a semiconductor junction having electroluminescent and photosensitive properties, said assembly of said two active regions consisting of a material having a smaller forbidden bandwidth that the material of said surface region, said surface region being a strongly doped and localized in a deposited layer that is of the same composition and that has a low doping, the depth of said junction with respect to the boundary between said layer and said assembly of active regions being between one-half and one-quarter of the diffusion length of the minority carriers in said active region of the first type, and said material of said assembly being selected such that the sum of one-third of said diffusion length of minority carrier in said first conductivity type active region and of the diffusion length of said minority carriers in the active region of said opposite conductivity type is between one and three absorption lengths of light rays of said wavelength range.

2. A device as in claim 1, wherein the depth of said junction with respect to the boundary between said deposited layer and said assembly of active regions is substantially equal to one-third of the diffusion length of the minority carriers in said active region of the first conductivity type.

3. A device as in claim 1, and adapted so that, when said junction is polarized under an operating voltage between 1 and 10 volts applied in the reverse direction, a depletion zone extends from said junction over a distance smaller than one-third of said diffusion length of the minority carriers in said active region of said first conductivity type.

4. A device as in claim 1, wherein the material of said assembly of the active regions has a direct band structure and is doped with impurities having a very low ionization energy.

5. A device as in claim 1, wherein the ratio of the doping concentrations in said surface region and in said deposited layer exceeds 100 to 1.

6. A device as in claim 1, comprising an epitaxial surface layer of N type conductivity, and underlying N conductivity type epitaxial layer of a material having a smaller forbidden bandwidth than said surface layer, and a substrate, and further comprising P type regions locally diffused down to said underlying layer and having an impurity concentration which gradually decreases from the surface, said diffused P region and said N layer of smaller forbidden bandwidth determining the active P-N junction.

7. A device as in claim 1, comprising an epitaxial surface layer of N type conductivity, an intermediate P type epitaxial layer of a material having a smaller forbidden bandwidth than said surface layer, an N type underlying epitaxial layer of the same material as said intermediate layer, and a substrate, said surface region being a region diffused locally down to said intermediate layer and having a P+ type conductivity and the said adjacent epitaxial layers of P and N type, respectively, determining the active PN junction.

8. A device as in claim 1, comprising a low doped P type epitaxial surface layer, a P type intermediate epitaxial layer of a material having a smaller forbidden bandwidth than said surface layer, an N type underlying epitaxial layer of the same material as said intermediate layer, and a substrate, said surface region being a diffused region and having a P+ conductivity type, said surface region reaching the P type intermediate layer and the adjacent said epitaxial layers of, respectively, P and N types determining the active PN junction.

9. A device as in claim 1, comprising a very thin P type, epitaxial surface layer, an intermediate N type epitaxial layer of a material having a smaller forbidden bandwidth than said surface layer, an underlying P type epitaxial layer of said material, and a substrate, said surface region being an implanted region of the N+ type and reaching the N type layer, the adjacent said epitaxial layers of, respectively, N and P conductivity determining the active PN junction.

10. A device as in claim 1, wherein the difference in forbidden bandwidth between the respective materials of said surface layer and said adjacent layer corresponds to a potential barrier of, at least 0.1 volt.

11. A device as in claim 1, wherein the material of said active regions is $Ga_{1-x}In_xAs$, in which $0.15 < x < 0.22$.

12. A device as in claim 1, wherein the material of the active region is $Ga_{1-y}Al_yAs$, in which $0.1 < y < 0.2$.

13. A photocoupler comprising at least an emitter element, a receiver element and an optical transmission means for transmitting the light from said emitter to said receiver, said transmission means being symmetrical and reversible, said photocoupler comprising two identical devices, each of the type recited in claim 1, said devices being disposed symmetrically with respect to the plane of symmetry of said optical transmission means.

14. A photocoupler as in claim 13, comprising two identical said devices and a bundle of optical fibers, the active faces of said devices being placed perpendicularly to the generatrix of said optical fibers.

15. A photocoupler as in claim 13, comprising two identical coplanar devices that are both manufactured on a common monolithic plate.

* * * * *

UNITED STATES PATENT AND TRADEMARK OFFICE
CERTIFICATE OF CORRECTION

PATENT NO. :  4,068,252
DATED      :  January 10, 1978
INVENTOR(S):  JACQUES LEBAILLY It is certified that error appears in the above-identified patent and that said Letters Patent are hereby corrected as shown below:

Col. 1, line 12, "determined" should be --determine-- line 23, after "advantageous" insert --for-- line 28, "best;" should be --best--

Col. 4, line 11, delete "of"

line 20, "an of the P type" should be --a P type-- line 40, after "arsenide of" insert --the N+ type, an N type epitaxial layer 22 of--

Col. 7, line 14, delete "of the P type"

UNITED STATES PATENT AND TRADEMARK OFFICE
CERTIFICATE OF CORRECTION

PATENT NO. : 4,068,252
DATED : January 10, 1978
INVENTOR(S) : JACQUES LEBAILLY

Sheet 2 of 2

It is certified that error appears in the above-identified patent and that said Letters Patent are hereby corrected as shown below:

Col. 7, line 34, "via/" should be --via contacts-- line 58, delete "at"

Claim 1, (Col. 8) line 47, "carrier" should be --carriers--

Claim 10, (Col. 8) line 13, delete ","

Signed and Sealed this

Twenty-second Day of August 1978

[SEAL]

Attest:

RUTH C. MASON
*Attesting Officer*

DONALD W. BANNER
*Commissioner of Patents and Trademarks*

UNITED STATES PATENT OFFICE
CERTIFICATE OF CORRECTION

Patent No. 4,068,252   Dated January 10, 1978

Inventor(s) Jacques Lebailly

It is certified that error appears in the above-identified patent and that said Letters Patent are hereby corrected as shown below:

Column 6, line 26, "of" should read -- having a --;

line 40, after "arsenide of" insert -- the N+ type, an N type epitaxial layer 22 of --.

Signed and Sealed this

Seventeenth Day of October 1978

[SEAL]

Attest:

RUTH C. MASON
*Attesting Officer*

DONALD W. BANNER
*Commissioner of Patents and Trademarks*